United States Patent
McCoy

(10) Patent No.: US 6,727,117 B1
(45) Date of Patent: Apr. 27, 2004

(54) SEMICONDUCTOR SUBSTRATE HAVING COPPER/DIAMOND COMPOSITE MATERIAL AND METHOD OF MAKING SAME

(75) Inventor: John Washington McCoy, San Diego, CA (US)

(73) Assignee: Kyocera America, Inc., San Diego, CA (US)

(*) Notice: Subject to any disclaimer, the term of this patent is extended or adjusted under 35 U.S.C. 154(b) by 0 days.

(21) Appl. No.: 10/291,126

(22) Filed: Nov. 7, 2002

(51) Int. Cl.[7] .......................... H01L 21/44; H01L 23/06; H01L 23/12; H01L 23/48; H01L 23/52
(52) U.S. Cl. .......................... 438/106; 257/684; 257/746
(58) Field of Search ................................. 438/106, 107, 438/112, 114, 121, 123, 800; 257/678, 684, 690, 702–709, 746, 750

(56) References Cited

U.S. PATENT DOCUMENTS

| | | | |
|---|---|---|---|
| 2,034,550 A | 3/1936 | Adams | |
| 2,401,221 A | 5/1946 | Bourne | |
| 3,303,026 A | 2/1967 | Zdnauk et al. | |
| 4,412,980 A | 11/1983 | Tsuji et al. | 423/446 |
| 5,008,737 A | 4/1991 | Burnham et al. | 357/81 |
| 5,024,680 A | 6/1991 | Chen et al. | 51/295 |
| 5,099,310 A | 3/1992 | Osada et al. | 357/81 |
| 5,120,495 A | 6/1992 | Supan et al. | 419/11 |
| 5,130,771 A | 7/1992 | Burnham et al. | 357/81 |
| 5,167,697 A | 12/1992 | Koumura et al. | 75/247 |
| 5,455,738 A | 10/1995 | Montesano et al. | 361/707 |
| 5,481,136 A | 1/1996 | Kohmoto et al. | 257/712 |
| 5,563,101 A | 10/1996 | Osada et al. | 437/209 |
| 5,686,676 A | 11/1997 | Jech et al. | 75/247 |
| 5,783,316 A | 7/1998 | Colella et al. | 428/660 |
| 5,886,407 A | 3/1999 | Polese et al. | 257/706 |
| 5,963,773 A | 10/1999 | Yoo et al. | 419/27 |

(List continued on next page.)

OTHER PUBLICATIONS

P.R.W. Hudson; "*The Thermal Resistivity of Diamond Heat-Sink Bond Materials*", J. Phys. D: Appl. Phys., 19: pp. 225–232, (1976).

D.P. Hasselman and L.F. Johnson; "*Effective Thermal Conductivity of Composites with Interfacial Thermal Barrier Resistance*", J. Composite Materials 21: pp. 508–515, (1987).

(List continued on next page.)

*Primary Examiner*—Craig A. Thompson
(74) *Attorney, Agent, or Firm*—Hogan & Hartson, LLP

(57) ABSTRACT

A semiconductor package for power transistors of the LDMOS type has a metallic substrate with a die mounted directly thereon, lead frame insulators mounted thereon adjacent the die and a plurality of leads mounted on the insulators and electrically coupled to the die by bond wires. The substrate includes a body having opposite surfaces comprising pure copper layers, and with the body interior being at least partially comprised of a copper/diamond composite so as to act as a heat spreader and provide improved heat removal and low thermal expansion, as well as an electrical connection for the die. The body may be entirely comprised of a copper/diamond composite, or it may be comprised of a copper/tungsten composite having a copper/diamond composite insert therein. The copper/diamond composite is comprised of diamond particles within a copper matrix. In a method of making the copper/diamond composite, diamond particles are coated with multiple layers of elements or inorganic compounds, mixed with a dry-processing binder and compacted in a die under pressure to form a compacted body. The body is placed on a quantity of copper, heated in a vacuum or hydrogen atmosphere to evaporate or decompose the binder, heated in a vacuum or hydrogen atmosphere to cause bonding or partial sintering of the coated diamond particles, then heated in a hydrogen atmosphere to a temperature slightly above the melting point of copper to melt and draw the copper into the bonded or partially sintered diamond particles. Following that, the compacted body is cooled and cut to the desired shape.

19 Claims, 2 Drawing Sheets

U.S. PATENT DOCUMENTS

| | | | | |
|---|---|---|---|---|
| 6,031,285 | A | 2/2000 | Nishibayashi | 257/706 |
| 6,106,957 | A | 8/2000 | Fang | 428/545 |
| 6,114,048 | A | 9/2000 | Jech et al. | 428/547 |
| 6,171,691 | B1 | 1/2001 | Nishibayashi | 428/325 |
| 6,238,454 | B1 | 5/2001 | Polese et al. | 75/243 |
| 6,284,556 | B1 * | 9/2001 | Wang et al. | 438/20 |

OTHER PUBLICATIONS

J.L. Johnson and R.M. German, "*Phase Equilibria on The Enhanced Liquid Phase Sintering of Tungsten–Cooper*", Metellurgical Transactions A, 24 A: pp. 2369–2377 )1993).

A.J. Lauder, J.C. Roesch, and M.J. Montesano; "*Diamond Metal Matrix Composites as an Electronic Packaging Material*", ISHM. '94 Proceedings: pp. 409–414.

J.A. Kerns, and N.J. Colella, D. Makowieki, and H.L. Davidson; "*Dymalloy: A Composite Substrate For High Power Density Electronic Components*", Proceedings of The International Symposium on Microelectronics, Oct. 24–26, 1995, Los Angeles, California.

S. Kumar, P. Ravindranathan, H.S. Devan, and R. Roy; "*Survial of Diamond at 2200° C. in Hydrogen*", Diamond and Related Materials 5: pp. 1246–1248, (1996).

* cited by examiner

SEMICONDUCTOR SUBSTRATE HAVING COPPER/DIAMOND COMPOSITE MATERIAL AND METHOD OF MAKING SAME

BACKGROUND OF THE INVENTION

1. Field of the Invention

The present invention relates to semiconductor packages, and more particularly to packages in which a transistor or other die is mounted together with an insulated lead frame on a metallic, electrically conductive substrate which acts as a heat spreader as well as an electrical connection for the die.

2. History of the Prior Art

It is known in the art to provide semiconductor packages in which a transistor or other die is mounted directly on a metallic substrate together with an insulated lead frame. In addition to mounting the die and the insulated lead frame, the substrate, which provides a further electrical connection for the die, acts as a heat spreader in order to provide desired heat removal. The die may be of the LDMOS (lateral diffusion metal oxide semiconductor) type and the package of the type for packaging LDMOS power transistors. A variety of different materials, metals and composites have been used in making the substrate, to the end that improved heat removal is constantly being sought. The substrate material must be chosen to have a low thermal expansion coefficient that matches those of the die and the insulator for the lead frame. Copper/tungsten composites are frequently used in the fabrication of such substrates.

While materials such as copper/tungsten composites have proven to be well suited for heat removal from the semiconductor package, these and other conventional designs still leave room for improvement, particularly in terms of their ability to remove heat during operation of the structure.

BRIEF DESCRIPTION OF THE INVENTION

The present invention provides improved semiconductor packaging structures and methods of making such structures. More particularly, the present invention provides improved substrate structures for mounting a die and an insulated lead frame thereon. The substrate structures provide for improved heat removal over the prior art structures, and have a desirably low thermal expansion coefficient. Further in accordance with the invention, advantageous methods are provided for making the substrates.

Semiconductor packages in accordance with the invention comprise a metallic substrate and a die mounted directly thereon, with the substrate including a body having opposite sides on which a pair of copper layers are formed, the die being mounted on one of the pair of copper layers, and the body being at least partially comprised of a copper/diamond composite. Diamonds have extremely high thermal conductivity and low thermal expansion so that when formed into a matrix with copper, an improved substrate is provided.

In a first embodiment according to the invention, the body is entirely comprised of a copper/diamond composite. In a second embodiment, the body is comprised of a copper/tungsten composite having a copper/diamond composite insert therein. In both cases, the semiconductor package includes an insulated lead frame coupled to one of the pair of copper layers adjacent the die. The lead frame comprises a plurality of leads coupled by bond wires to the die. Preferably, the body is of generally planar configuration and has a generally uniform thickness between opposite sides.

The pair of copper layers are of relatively thin, generally planar configuration.

The copper/diamond composite is comprised of diamond particles within a copper matrix. The diamond particles may be coated with one or more of Cr, W, Mo, Co, Cu, Ti, Si, SiC, TiN, TiC, Ta and Zr. In a preferred embodiment, the diamond particles are coated with a layer of Cr, a layer of W, a layer of Co, and a layer of Cu.

In a preferred method of making a copper/diamond composite for use in semiconductor substrates, according to the invention, diamond particles are coated with multiple layers of elements or inorganic compounds. The coated particles are mixed with a dry-processing binder, and are compacted in a die under pressure to form a compacted body. The compacted body is placed on or under a piece of copper and heated in a vacuum or hydrogen atmosphere to evaporate or decompose the binder. The compacted body is then heated in a vacuum or hydrogen atmosphere to cause bonding or partial sintering of the coated diamond particles. The compacted body is then heated in a hydrogen atmosphere to a temperature slightly above the melting point of copper to melt and draw the copper into the bonded or partially sintered diamond particles. Following this, the compacted body is cooled, and is cut to a desired shape. Following cutting, copper layers may be bonded to opposite sides of the body such as by brazing.

To make a substrate in accordance with the second embodiment described above, a copper/tungsten composite is provided. The compacted body and the copper/tungsten composite are then heated to above the melting point of copper to integrate the compacted body with the copper/tungsten composite. The result is a substrate of copper/tungsten composite having a copper/diamond insert therein.

The step of cooling the compacted body may simply comprise cooling the body to room temperature. Alternatively, the step may comprise partially cooling the compacted body, establishing a low pressure atmosphere around the compacted body, and re-heating the compacted body to above the melting point of copper long enough to remove dissolved hydrogen from the copper.

BRIEF DESCRIPTION OF THE DRAWINGS

A detailed description of embodiments of the invention will be made with reference to the accompanying drawings, in which.

BRIEF DESCRIPTION OF PREFERRED EMBODIMENTS

Figure 1:
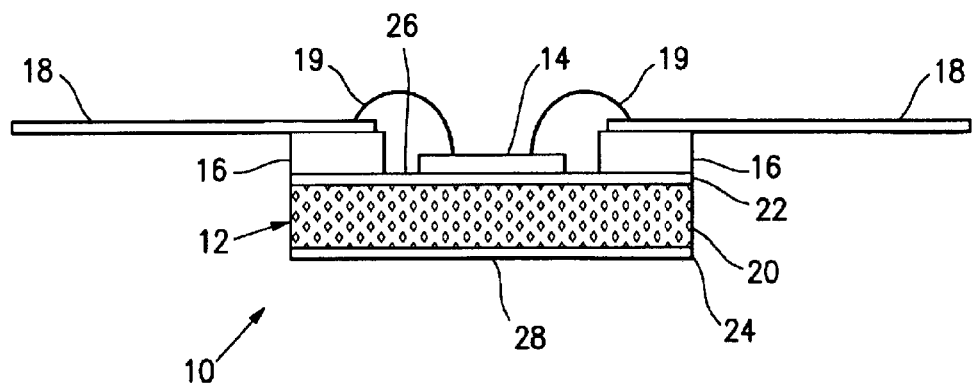
FIG. 1 is a plan view of a first embodiment of a semiconductor package in accordance with the invention.

FIG. 1 shows a first embodiment of a semiconductor package 10 in accordance with the invention. The package 10 includes a generally planar substrate 12 of relatively uniform thickness on which a die 14 is mounted. The die 14 may comprise a transistor or other semiconductor device. Also mounted on the substrate 12 adjacent the die 14 are insulators 16 of a lead frame 18 comprised of multiple leads electrically coupled by bond wires 19 to the die 14.

The semiconductor package 10 shown in FIG. 1 is the type in which a die is mounted directly on top of a metallic, thermally and electrically conductive flange. The flange is formed by the substrate 12. It will be understood by those skilled in the art however, that the principles of the present invention to be described hereafter apply to other types of semiconductor packages as well.

In the semiconductor package 10 of the type shown in FIG. 1, the substrate 12 forms an electrical connection for the die 14. Most importantly, however, the substrate 12 forms a heat spreader which functions to remove heat from the semiconductor package 10. The substrate 12 includes a body 20 having a pair of pure copper layers 22 and 24 mounted on opposite broad surfaces 26 and 28 thereof respectively.

In accordance with the invention, the body 20 comprises a copper/diamond composite having diamond particles within a copper matrix. Diamonds have extremely high thermal conductivity. This property is utilized in the formation of the body 20 of a copper/diamond composite. Such composites provide unique combinations of thermal conductivity, thermal expansion and electrical conductivity, depending on the loading fraction of the diamonds (the volume ratio of copper to diamond). In addition, the relatively high cost of diamond particles is controlled by a preferred method of making the composite in accordance with the invention, which is described hereafter in connection with FIG. 3.

Figure 3:
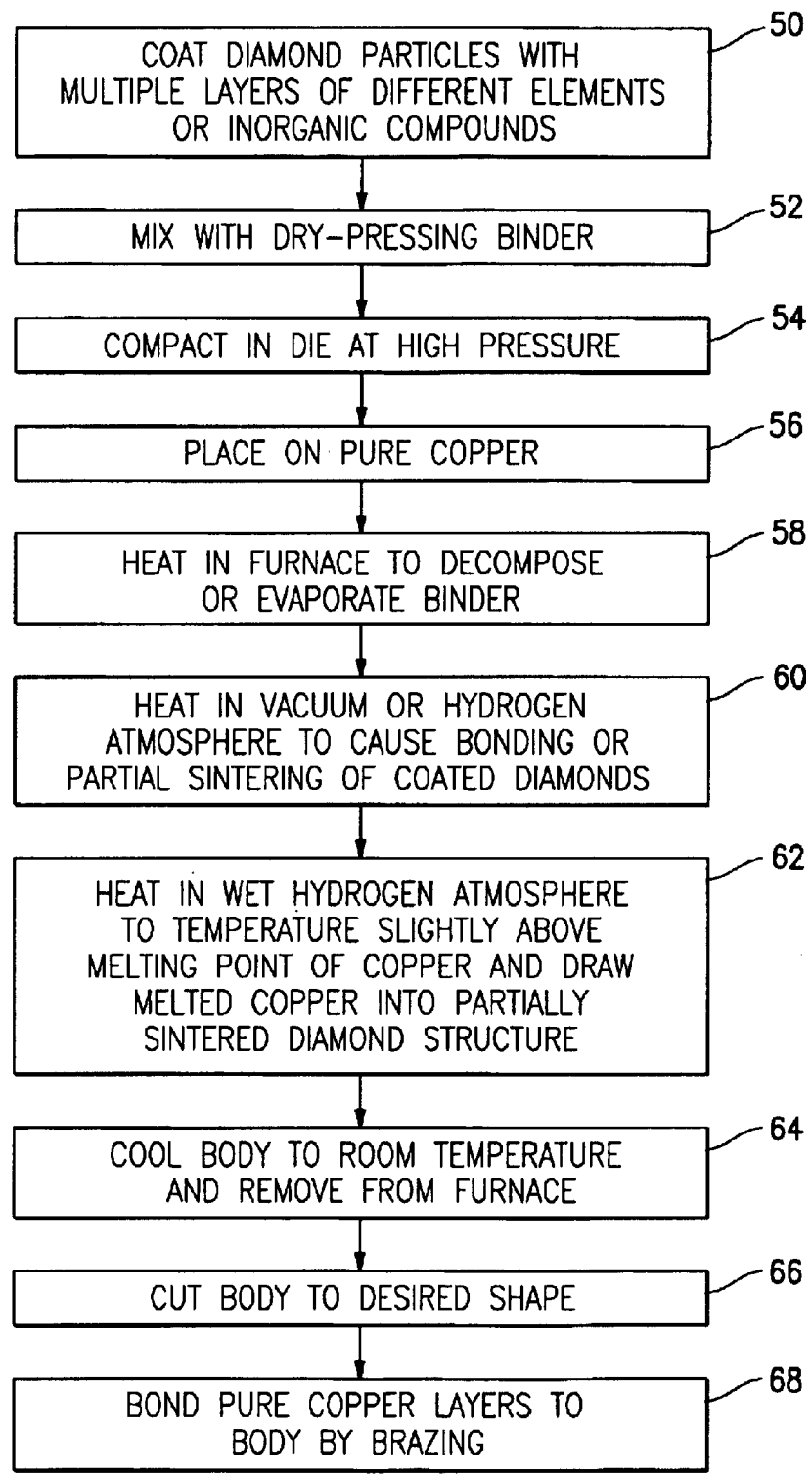
FIG. 3 is a block diagram of the successive steps of a preferred method of making a copper/diamond composite according to the invention.

As described hereafter in connection with the method of FIG. 3, the copper layers 22 and 24 are bonded to the broad surface of 26 and 28 of the body 20, such as by brazing, upon completion of the body 20. The copper layers 22 and 24 enable the substrate 12 to be more easily lapped flat. This is because the pure copper of the layers 22 and 24 is easier to lap than the diamond-containing composite of the body 20. In addition, the pure copper of the layers 22 and 24 covers up exposed pores and exposed bare diamonds in the composite of the body 20, which otherwise would cause defects in any electroplated coating applied to the package before attachment of the die.

Figure 2:
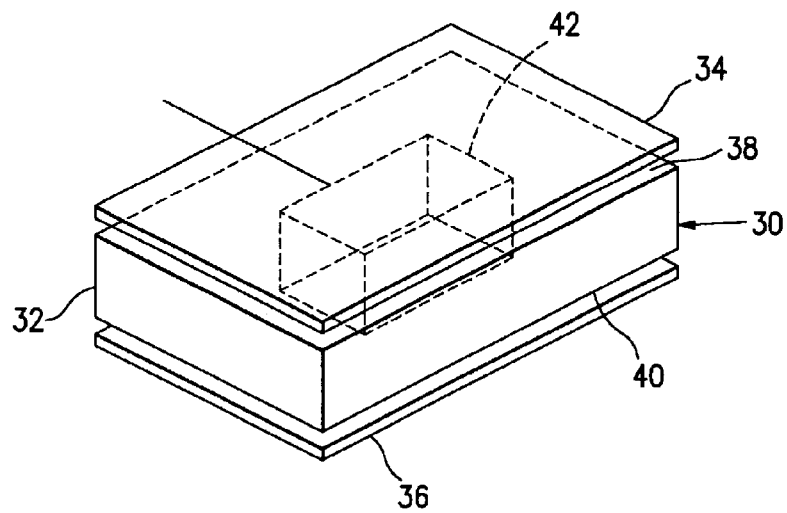
FIG. 2 is a perspective view, shown partly broken apart and in phantom, of the substrate of a second embodiment according to the invention.

FIG. 2 shows an alternative embodiment in accordance with the invention. In FIG. 2, the substrate 12 of FIG. 1 is replaced by a substrate 30. Like the substrate 12 of FIG. 1, the substrate 30 has a body 32 with copper layers 34 and 36 bonded on opposite broad surfaces 38 and 40 thereof. However, whereas the body 20 of FIG. 1 is entirely comprised of a copper/diamond composite, the body 32 of FIG. 2 is only partially comprised of a copper/diamond composite. More specifically, the body 32 of the substrate 30 is comprised of a copper/tungsten composite with an insert 42 therein which comprises a copper/diamond composite. The body 32 provides the embodiment of FIG. 2 with good heat removal as does the body 20 of FIG. 1. At the same time, the copper/tungsten composite is less expensive and is easier to machine. Ease of machining is especially important when bolt holes must be provided in the flange. Cost savings are realized by using the copper/diamond composite only in the area generally beneath the die 14, where its higher thermal conductivity is most effectively utilized. By forming the copper/diamond composite as the insert 42 within the copper/tungsten composite, the thermal expansion of the consolidated body is mostly controlled by the coefficient of thermal expansion of the copper/tungsten composite.

As previously described, the formation of at least part of the substrate from a copper/diamond composite in accordance with the invention provides the semiconductor package with a flange capable of improved heat removal. This is true when compared with the copper/tungsten composites and other composites and materials typically used in the substrates of prior art structures. Diamonds have extremely high heat conductivity. They also have very low thermal expansion, which provides the copper/diamond composite with a low thermal expansion coefficient that matches those of the die and the lead frame insulators. If the thermal expansion coefficient of the substrate is too high, the die or the lead frame insulators will crack when being brazed to the substrate.

However, diamonds they are expensive and can be difficult to process when forming composites thereof.

The preferred method of making the copper/diamond composites in accordance with the invention, which is illustrated in FIG. 3, had to be designed to overcome the problems in working with diamonds in the production of a composite material. In addition to the high cost of the diamonds themselves, diamond-containing composites are likely to be expensive to process. Also, diamonds tend to transform into graphite when heated, and are difficult to bond to copper. Diamond-containing materials can be difficult to form into a useful shape. Also, diamonds can be difficult to couple to copper in a way that allows both effective heat transfer across the interface and strong mechanical strength which is required for reduction of the thermal expansion coefficient of the composite.

The preferred method illustrated in FIG. 3 overcomes these various disadvantages in the formation of a copper/diamond composite for use in the substrates of semiconductor packages.

In a first step 50 of the method of FIG. 3, diamond particles are coated with multiple layers of different elements or inorganic compounds. Preferably, diamond powder, which is either synthetic or natural and which has an average particle size between 20 microns and 120 microns, is coated with multiple layers of different elements or inorganic compounds. The coating method employed is fluidized-bed chemical vapor deposition. Optionally, autocatalytic (electrodeless) aqueous chemical plating can be used. Sublayers of the coating may be deposited by one method and other layers by the other method. Individual layers of the coating may be comprised of elements or compounds taken from the group which includes Cr, W, Mo, Co, Cu, Ti, Si, SiC, TiN, TiC, Ta and Zr. A preferred embodiment of the diamond coating in accordance with the invention involves a four-layer system in which the particles are first coated with a layer of Cr, followed by a layer of W, then a layer of Co, and then a layer of Cu. The thickness of each layer is between 30 nanometers and 2 microns.

In a second step 52 shown in FIG. 3, the coated diamond particles are mixed with a dry-pressing binder. Optionally, the particles may also be mixed with copper powder.

In a third step 54 shown in FIG. 3, the particles are compacted in a die at high pressure. Such pressure is preferably between 15,000 and 50,000 pounds per square inch.

In a fourth step 56 shown in FIG. 3, the body which results from compaction is placed on top of a piece of pure copper and loaded into a furnace.

In a fifth step 58 shown in FIG. 3, the body is heated in either vacuum or a wet hydrogen atmosphere to evaporate or thermally decompose the dry-pressing binder. The heating is continued so that the body is exposed to at least 700° C. for at least 10 minutes in a wet hydrogen atmosphere to reduce all copper oxides and to convert any carbonaceous residues on the copper or on the diamond coating to CO or $CO_2$.

In a sixth step 60 shown in FIG. 3, the compacted body is heated in a vacuum or hydrogen atmosphere to cause bonding or partial sintering of the coated diamonds. In this step, the compacted body is preferably heated to 950° C. for at least 10 minutes in either a vacuum or a hydrogen atmosphere. This causes bonding or "artial sintering" of the coated diamonds, causing them to adhere to each other at points of contact.

In a seventh step 62 shown in FIG. 3, the body is heated in a wet or dry hydrogen atmosphere to a temperature slightly above the melting point of copper to draw melted copper into the partially sintered diamond structure. This is preferably done at a temperature of 1200° C. The body is held at this temperature for at least 2 minutes. When the copper melts, it is drawn by capillary force into the partially sintered diamond compact. If the coating system is effective, the copper completely infiltrates the compact, leaving a pore-free composite body.

In an eighth step 64 shown in FIG. 3, the body is cooled to room temperature and removed from the furnace. In an optional step corresponding to the step 64, the body is cooled to about 900° C., and then the furnace atmosphere is evacuated to a vacuum level of at least $1 \times 10^{-4}$ torr. It is then re-heated above the copper melting point in vacuum and is held for at least 15 minutes to remove dissolved hydrogen from the metal.

In a ninth step 66 shown in FIG. 3, the body is cut to a desired shape so as to be usable in the package configurations shown in FIG. 1 or 2. Shaping can be done by electric discharge machining (EDM) or by free-abrasive lapping (using diamond abrasive), or a combination of the two.

In a tenth step 68 shown in FIG. 3, copper layers corresponding to the layers 22 and 24 of FIG. 1 and 34 and 36 of FIG. 2 are bonded to the opposite broad surfaces of the body of the substrate, such as by brazing.

In the case of the second embodiment of FIG. 2, further processing is required in order to form the body 32 with the two different composites. In this case, the copper/diamond composite insert 42 is bonded into the surrounding copper/tungsten composite by re-melting it so as to allow the copper matrices within each material to flow and intermingle.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor package comprising a metallic substrate including a body having opposite surfaces comprised of pure copper layers, the body being least partially comprised of a copper/diamond composite.

2. A semiconductor package according to claim 1, wherein the body is entirely comprised of a copper/diamond composite.

3. A semiconductor package according to claim 1, wherein the body is comprised of a copper/tungsten composite having a copper/diamond composite insert therein.

4. A semiconductor package according to claim 1, further including a die mounted on one of the pair of copper layers, a plurality of insulators mounted on the one of the pair of copper layers adjacent the die, a plurality of leads mounted on the insulators and a plurality of bond wires coupling the leads to the die.

5. A semiconductor package according to claim 1, wherein the body is of generally planar configuration having generally uniform thickness between opposite sides and the pair of copper layers are of relatively thin, generally planar configuration.

6. A semiconductor package according to claim 1, wherein the copper/diamond composite is comprised of diamond particles within a copper matrix.

7. A semiconductor package according to claim 6, wherein the diamond particles are coated with one or more of Cr, W, Mo, Co, Cu, Ti, Si, SiC, TiN, TiC, Ta and Zr.

8. A semiconductor package according to claim 6, wherein the diamond particles are coated with a layer of Cr, a layer of W, a layer of Co and a layer of Cu.

9. A semiconductor package comprising a metallic substrate, a die mounted on the substrate, ceramic lead frame insulators mounted on the substrate adjacent the die, and metal leads mounted on the lead frame insulators and electrically coupled to the die, the substrate being comprised of a generally planar body which is at least partially comprised of a composite of diamond particles in a matrix of copper.

10. A semiconductor package according to claim 9, wherein the body is of relatively uniform thickness between opposite surfaces, and further including a pair of pure copper layers formed on the opposite surfaces of the body.

11. A semiconductor package according to claim 9, wherein the body is completely comprised of a composite of diamond particles in a matrix of copper.

12. A semiconductor package according to claim 9, wherein the body is comprised of a copper/tungsten composite having an insert therein comprised of diamond particles in a matrix of copper.

13. A method of making a copper diamond composite comprising the steps of:

coating diamond particles with multiple layers of certain elements or inorganic compounds;

mixing the coated particles with a dry-processing binder;

compacting the particles in a die under pressure to form a compacted body;

placing the compacted body adjacent a piece of copper and heating in a vacuum or wet hydrogen atmosphere to evaporate or decompose the binder;

heating the compacted body in a vacuum or hydrogen atmosphere to cause bonding or partial sintering of the coated diamond particles;

heating the compacted body in a hydrogen atmosphere to a temperature slightly above the melting point of copper to melt and draw the copper into the bonded or partially sintered diamond particles;

cooling the compacted body; and cutting the compacted body to a desired shape.

14. A method according to claim 13, comprising the further step of forming pure copper layers on opposite sides of the compacted body.

15. A method according to claim 13, comprising the further steps of:

providing a copper/tungsten composite; and heating the compacted body and the copper/tungsten composite to above the melting point of copper to integrate the compacted body with the copper/tungsten composite.

16. A method according to claim 13, wherein the step of cooling the compacted body comprises the steps of:

partially cooling the compacted body;

establishing a low pressure atmosphere around the compacted body; and re-heating the compacted body to above the melting point of copper long enough to remove dissolved hydrogen from the copper.

17. A method according to claim 13, wherein the step of coating diamond particles with multiple layers of certain elements or inorganic compounds comprises coating the diamond particles using fluidized bed chemical vapor deposition or autocatalytic aqueous chemical plating.

18. A method according to claim 13, wherein the step of coating diamond particles with multiple layers of elements or inorganic compounds comprises coating the diamond particles with one or more of Cr, W, Mo, Co, Cu, Ti, Si, SiC, TiN, TiC, Ta and Zr.

19. A method according to claim 13, wherein the step of coating diamond particles with layers of elements or inorganic compounds comprises comprises coating the diamond particles with a layer of Cr, then a layer of W, then a layer of Co, then a layer of Cu.

* * * * *